(12) United States Patent
Schweizer et al.

(10) Patent No.: US 9,651,603 B2
(45) Date of Patent: May 16, 2017

(54) METHOD AND POWER CONVERTER FOR DETERMINING CELL CAPACITOR DEGRADATION IN A CONVERTER CELL

(71) Applicant: ABB Schweiz AG, Baden (CH)

(72) Inventors: Mario Schweizer, Zürich (CH); Roman Grinberg, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/100,575

(22) PCT Filed: Nov. 27, 2014

(86) PCT No.: PCT/EP2014/075797
§ 371 (c)(1),
(2) Date: May 31, 2016

(87) PCT Pub. No.: WO2015/090892
PCT Pub. Date: Jun. 25, 2015

(65) Prior Publication Data
US 2016/0313387 A1    Oct. 27, 2016

(30) Foreign Application Priority Data

Dec. 19, 2013 (EP) ..................................... 13198286

(51) Int. Cl.
*G01R 31/02* (2006.01)
*H02M 1/088* (2006.01)
(Continued)

(52) U.S. Cl.
CPC .......... *G01R 31/028* (2013.01); *H02M 1/088* (2013.01); *H02M 7/483* (2013.01); *G01R 31/40* (2013.01); *H02M 2007/4835* (2013.01)

(58) Field of Classification Search
None
See application file for complete search history.

(56) References Cited

U.S. PATENT DOCUMENTS 4,621,227 A    11/1986  Venema
7,380,891 B2 *  6/2008  Ohashi .................. B60R 16/023
                                              303/122.05
(Continued)

FOREIGN PATENT DOCUMENTS

CN    102495292 A    6/2012
JP    2003274566 A   9/2003
WO      0218962 A1   3/2002

OTHER PUBLICATIONS

Machine English Translation of JP2003274566 to Morisada.*
(Continued)

*Primary Examiner* — Jermele M Hollington
*Assistant Examiner* — Douglas X Rodriguez
(74) *Attorney, Agent, or Firm* — Whitmyer IP Group LLC

(57) ABSTRACT

A method and arrangement for determining a capacitor degradation parameter associated with the degree of degradation of a cell capacitor in a converter cell of a power converter including a plurality of identical converter cells, including redundant converter cells, which converter cell, prior to determining the capacitor degradation parameter, has been bypassed. The method includes a) obtaining a measurement parameter value associated with discharging of the cell capacitor, forming a dc-link, from a measurement start voltage level at a measurement start time to a measurement end voltage level at a measurement end time, and b) determining a value of the capacitor degradation parameter based on the measurement parameter value.

8 Claims, 2 Drawing Sheets

(51) Int. Cl.
    *H02M 7/483*     (2007.01)
    *G01R 31/40*     (2014.01)

(56) References Cited

U.S. PATENT DOCUMENTS

| | | |
|---|---|---|
| 2006/0250144 A1 | 11/2006 | Braun et al. |
| 2009/0072982 A1 | 3/2009 | Cheng et al. |
| 2010/0007361 A1* | 1/2010 | Yamanaka ............ H02J 1/14 |
| | | 324/678 |
| 2010/0161259 A1 | 6/2010 | Kim et al. |
| 2010/0295554 A1 | 11/2010 | Alho |
| 2010/0321038 A1 | 12/2010 | Dommaschk et al. |
| 2011/0018551 A1* | 1/2011 | Yamane ............... B60K 6/46 |
| | | 324/548 |
| 2013/0094262 A1 | 4/2013 | Avrutsky |

OTHER PUBLICATIONS

International Preliminary Report on Patentability, Application No. PCT/EP2014/075797, Issued: Apr. 1, 2016, 10 pages.
International Search Report, Application No. PCT/EP2014/075797, Completed: Jan. 26, 2016: Mailing Date: Feb. 2, 2015, 10 pages.
Wechsler, Andrew et al., "Consition Monitoring of DC-Link Capacitors in Aerospace Drives", IEEE Transactions on Industry Applications, vol. 48, No. 6, Nov./Dec. 2012, pp. 1866-1874.
Witten Opinion of the International Preliminary Examining Authority, Application No. PCT/EP2014/075797, Issued: Dec. 23, 2015, 7 pages.

\* cited by examiner

METHOD AND POWER CONVERTER FOR DETERMINING CELL CAPACITOR DEGRADATION IN A CONVERTER CELL

TECHNICAL FIELD

The present disclosure generally relates to power converters comprising converter cells which include semiconductor switching modules and a cell capacitor. In particular, it relates to a method and to an arrangement for determining cell capacitor degradation in a converter cell.

BACKGROUND

In many applications, high reliability of power converters is required. In voltage source converters, the capacitor bank, in the following referred to as cell capacitor, is one of the major parts causing failures of the power converter because the often implemented electrolytic capacitors have only a limited lifetime.

Especially in modular multilevel converters (MMC), aging of the cell capacitors is a particular problem as the capacitors are subject to high currents at multiples of the fundamental and at the switching frequency, leading to early aging and capacitance drop. As such modular multilevel converters are designed for high reliability, health monitoring of the cell capacitor is of major importance.

During the aging process of electrolytic capacitors, the capacitance drops continuously and the equivalent series resistance (ESR) increases. Many manufacturers define the end-of-life of their capacitors if the initial capacitance has dropped by 20% and/or the ESR has increased by 200-300%.

US2010/0321038 discloses a device for monitoring the aging of the capacitors in a power converter comprising a number of converter cells, by means of capacitance measurement. For each phase module a branch current sensor for detecting a phase module branch current is provided. Furthermore, for each submodule there exists a submodule sensor for detecting a capacitor voltage dropped across the capacitor, means for detecting the switching states of the submodule, and an evaluation unit for determining the capacitance of the capacitors of each phase module. The determining of the capacitance is dependent on the integration of the measured phase module branch current, the switching state or states and the capacitor voltage. This yields the charge change of the capacitors. The capacitance of each capacitor results from the division of the charge change with the voltage change. The charge and voltage are detected between the turn-on and turn-off instants of the submodule.

The above-described method relies on both current and voltage measurements, and especially on computations such as integration of the detected branch currents in order to determine the capacitance.

SUMMARY

An object of the present disclosure is to provide a method and an arrangement which enables simple and reliable cell capacitor degradation determination when the power converter is in an online state.

Hence, according to a first aspect of the present disclosure there is provided a method of determining a capacitor degradation parameter associated with the degree of degradation of a cell capacitor in a converter cell of a power converter comprising a plurality of identical converter cells, including redundant converter cells, which converter cell, prior to determining the capacitor degradation parameter, has been bypassed, wherein the method comprises:
  a) obtaining a measurement parameter value associated with discharging of the cell capacitor, forming a dc-link, from a measurement start voltage level at a measurement start time to a measurement end voltage level at a measurement end time, and
    determining a value of the capacitor degradation parameter based on the measurement parameter value.

An effect which may be obtainable thereby is that a value of the capacitor degradation parameter may be determined in a simple manner, because the method relies on large voltage differences instead of small voltage variations on top of a high dc-link voltage, without having to set the power converter in an offline mode. Due to a voltage swing used for the measurement is relatively large, in some applications in the order of 100 V, sensitivity to for example noise is greatly enhanced and problems with the measurement resolution are reduced as A/D converter resolution normally limits the measurement of small voltage ripples on top of e.g. a 1000 V dc-link voltage.

By means of redundancy, the degradation level of the cell capacitor in any converter cell in the power converter may be determined while the power converter is in operation. For this purpose, the converter cell that is to be subjected to the cell capacitor degradation measurement is bypassed, wherein the cell capacitor degradation may be performed by simple time measurements at two voltages, namely the starting voltage and the measurement end voltage, or by measuring the measurement end voltage if the time difference between a predetermined starting voltage and the measurement end voltage, which in this case is unknown, is predetermined.

According to one embodiment the measurement start voltage level and the measurement end voltage level are predetermined, and wherein the measurement parameter value is a time difference between the measurement start time and the measurement end time.

According to one embodiment measurement start time and measurement end time are predetermined and the measurement parameter value is the measurement end voltage.

According to one embodiment the measurement start voltage level is below a nominal dc-link voltage level, the nominal dc-link voltage level being the voltage level across the dc-link when the converter cell is in operation.

According to one embodiment the measurement end voltage level is above a converter cell undervoltage protection level.

According to one embodiment in step b) the determining of the value of the capacitor degradation parameter is further based on the measurement start voltage level and the measurement end voltage level.

According to one embodiment the capacitor degradation parameter value is the capacitance of the cell capacitor.

According to one embodiment step b) is further based on a cell resistor value.

According to one embodiment the determining in step b) is further based on a power consumption of an auxiliary power supply of the converter cell.

According to one embodiment the determining in step b) comprises determining a ratio between the time difference and a reference time difference indicative of the discharge time from the starting voltage to the measurement end voltage of a new cell capacitor. Thereby, it is not necessary to determine or know the current capacitance nor the reference capacitance, nor the resistor value, nor the power consumption of the auxiliary power supply. By means of the ratio between only the two time differences, a measure of the cell capacitor degradation may be obtained.

One embodiment comprises obtaining a current temperature of the cell capacitor and comparing the current temperature with a reference temperature to determine the reliability of determining the capacitor degradation parameter.

According to a second aspect of the present disclosure there is provided a power converter comprising a plurality of identical converter cells, each converter cell comprising a cell capacitor, and each converter cell being arranged to be bypassed, the power converter further comprising a processor for determining a capacitor degradation parameter associated with the degree of degradation of a cell capacitor, the processor being arranged to obtain a measurement parameter value associated with discharging of the cell capacitor from a measurement start voltage level at a measurement start time to a measurement end voltage level at a measurement end time when the converter cell is bypassed, and to determine a value of the capacitor degradation parameter based on the measurement parameter value.

According to one embodiment the measurement start voltage level and the measurement end voltage level are predetermined, and wherein the measurement parameter value is a time difference between the measurement start time and the measurement end time.

According to one embodiment the measurement start time and measurement end time are predetermined and the measurement parameter value is the measurement end voltage.

According to one embodiment the processor is arranged to determine the value of the capacitor degradation parameter by means of a ratio between the time difference and a reference time difference indicative of the discharge time from the starting voltage to the measurement end voltage of a new cell capacitor.

According to one embodiment the processor is arranged in a local converter cell controller or a supervisory power converter controller.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
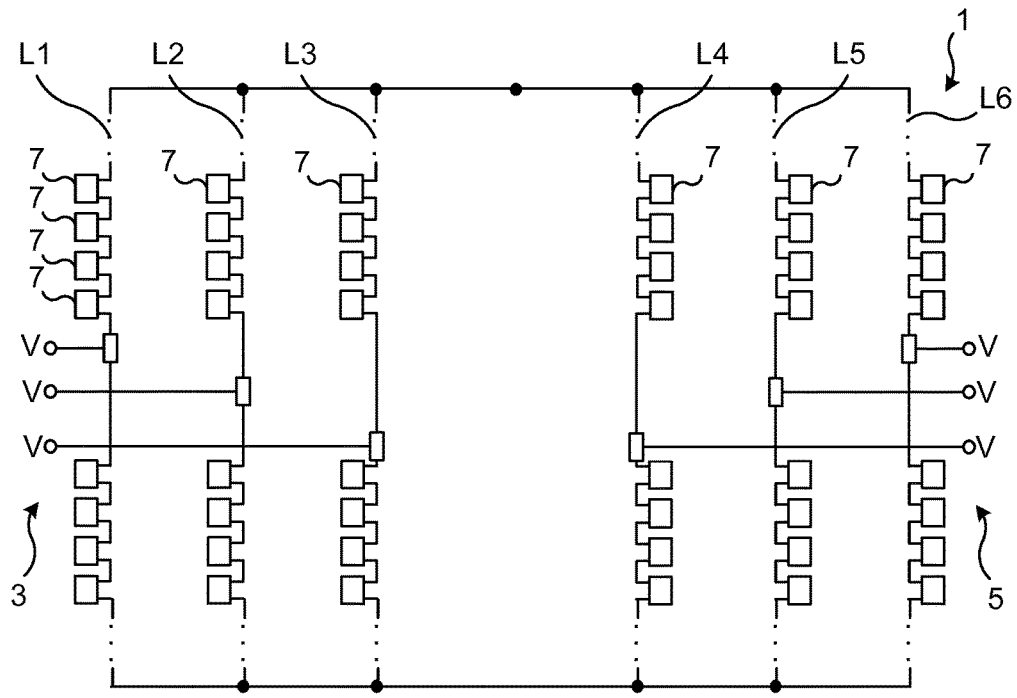
FIG. 1 schematically depicts an example of a power converter comprising a plurality of converter cells.

FIG. 1 schematically illustrates a power converter 1. The exemplified power converter is a three-phase alternating current (AC) to AC converter. Especially, it is a modular multilevel converter (MMC). It should be noted that the present concept could be utilised in an MMCS of any type, or in general any type of power converter which comprises a number of identical converter cells, including redundant converter cells. Examples of such power converters are a rectifier, an inverter, a direct current (DC) to DC converter or an uninterruptable power supply (UPS). The present concept could also be utilised with power converters arranged to handle fewer or more electrical phases than the exemplified three phases.

The exemplified power converter 1 comprises a plurality of legs L1-L3 on an input terminal side 3 of the power converter 1, and a plurality of legs L4-L6 on an output terminal side 5 of the power converter 1. Each leg L1-L6 comprises a plurality of identical converter cells 7. Each converter cell 7 comprises semiconductor switching modules and a cell capacitor. The converter cells are utilised to enable the power converter to convert the input voltage of each electrical phase to a desired output voltage and/or frequency of a corresponding electrical phase. The operation of power converters is well-known, and will not be described in more detail herein.

Figure 2:
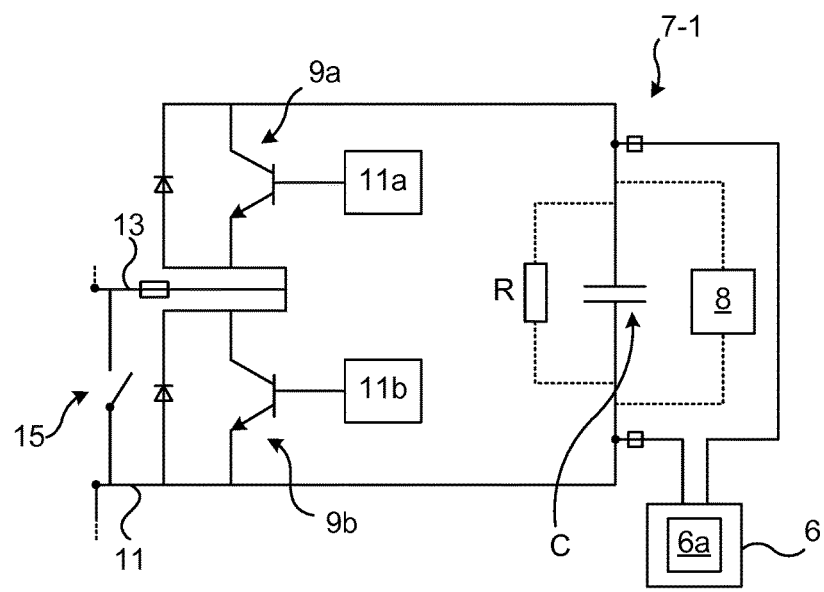
FIG. 2 depicts an example of a half-bridge converter cell and an arrangement for determining the degree of degradation of the cell capacitor.

FIG. 2 shows an example of a converter cell 7-1 and an arrangement 6 for determining the degradation of a cell capacitor. The arrangement 6 comprises a processor 6a and is provided with a computer program comprising computer-executable components which when run on the processor 6a, performs the steps of the method(s) for determining a capacitor degradation parameter associated with the degradation of a cell capacitor as presented herein.

The converter cell 7-1 is of half-bridge type, and comprises a plurality of semiconductor switching modules 9a, 9b. Each semiconductor switching module 9a, 9b comprises a semiconductor switch and a diode connected in anti-parallel with the semiconductor switch. The semiconductor switching module may for example be of IGBT type or of gate-controlled thyristor type.

The converter cell 7-1 also comprises a cell capacitor, or dc-link capacitor, C connected between the collector of the semiconductor switching module 9a and the emitter of the other semiconductor switching module 9b. The converter cell 7-1 has one terminal 13, according to the example in FIG. 2 the DC side, between the emitter of the upper semiconductor switching module 9a and the collector of the lower semiconductor switching module 9b. The other terminal 11, according to the example the AC side, is at the emitter of the lower semiconductor switching module 9b. Note, the terms lower and upper merely refer to the placement of the semiconductor switching modules as shown in FIG. 2.

The converter cell 7-1 comprises a gate unit 11a connected to the gate of the semiconductor switching module 9a to control the switching of that semiconductor switching module, and a gate unit 11b connected to the gate of the semiconductor switching device 9b to control the switching of that semiconductor switching module. The gate units hence control the gate voltage to the semiconductor switching modules. Normal operation of converter cells is well-known in the art, and will not be discussed any further herein.

According to one variation, the converter cell 7-1 may comprise a cell resistor R, such as a balancing resistor and/or discharge resistor. The magnitude of such a cell resistor R is known. The cell resistor R may be used for limiting the discharge current when the cell capacitor C is being discharged. According to one variation the converter cell 7-1 comprises an auxiliary power supply 8 arranged to power the gate units 11a, 11b. The auxiliary power supply is arranged to consume a constant amount of power. According to one variation, the cell converter comprises both the resistor and the auxiliary power supply, as schematically shown in both FIG. 2 and FIG. 3.

The arrangement 6, especially the processor 6a, is arranged to obtain a measurement parameter value associated with the discharging of the cell capacitor C from a measurement start voltage level at a measurement start time to a measurement end voltage level at a measurement end time, and based on the measurement parameter value to determine a capacitor degradation parameter value associated with the degree of degradation of the cell capacitor C. The capacitor degradation parameter may for example be a measure of the capacitance of the cell capacitor C, or a ratio which relates the current capacitance of the cell capacitor to a reference capacitance of the cell capacitor, corresponding to the capacitance of a new cell capacitor. The measurement parameter value may be the discharge time, i.e. time difference between the measurement start time and the measurement end time, from the measurement start voltage level to the measurement end voltage level, or the measurement end voltage level in case the discharge time is predetermined.

The arrangement 6 may for example be a local converter cell controller arranged to control only the operation of the converter cell, e.g. switching of the semiconductor switching modules 9a, 9b, or a supervisory power converter controller arranged to provide supervisory control of the entire power converter.

Figure 3:
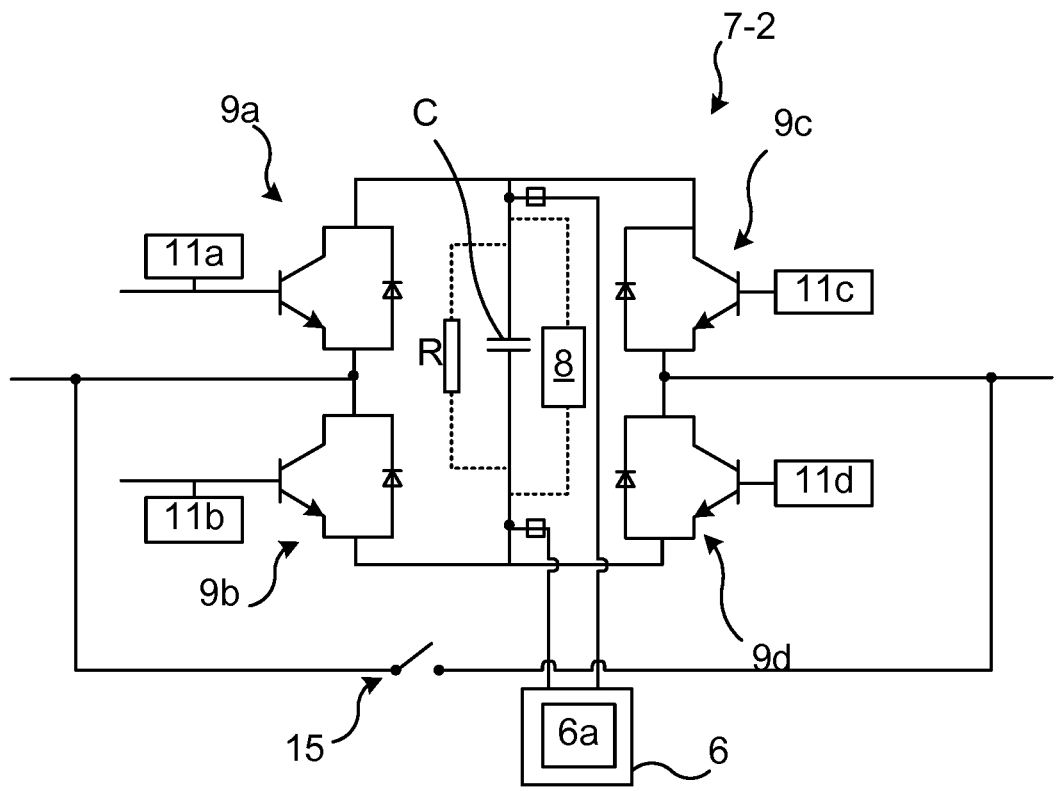
FIG. 3 depicts an example of a full-bridge converter cell and an arrangement for determining the degree of degradation of the cell capacitor.

FIG. 3 depicts another example of a converter cell for which the degradation of the cell capacitor may be determined. The converter cell 7-2 is of full-bridge type and comprises a plurality of semiconductor switching modules 9a-9d, and a cell capacitor C. The converter cell 7-2 comprises gate units 11a-11d, each being arranged to control the gate voltage of the gate of a respective semiconductor switching module 9a-9d. The converter cell 7-2 may have a bypass switch 15 for bypassing thereof.

The arrangement 6 is identical to the arrangement presented in FIG. 2, and is thus arranged to determine the degree of degradation of the cell capacitor C of the converter cell 7-2.

Although in FIGS. 2 and 3, the arrangement 6 is connected to the terminals of the cell capacitor C, it should be noted that these only illustrate that the arrangement 6 in some sense is connected to the terminals of the cell capacitor. This could be directly in case the arrangement is a local converter cell controller, or indirectly via a local converter cell controller in case the arrangement is a supervisory converter cell controller. It is also contemplated that this connection could be a wireless connection via for example the local converter cell controller to a supervisory power converter controller.

Figure 4:
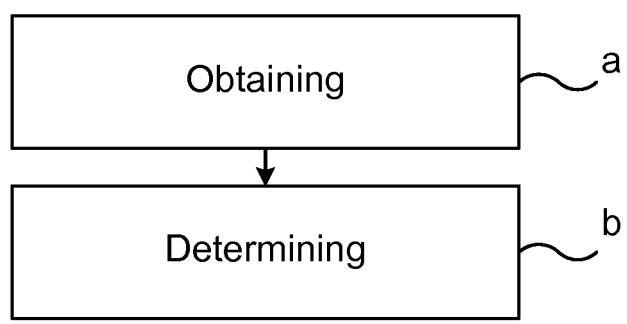
FIG. 4 is a flowchart of a method of determining a capacitor degradation parameter associated with the degradation of a cell capacitor in a converter cell of a power converter.

The operation of several examples of determining a capacitor degradation parameter associated with the degradation of a cell capacitor will now be described with reference to FIG. 4.

In short, the method(s) of determining the capacitor degradation parameter associated with the degree of degradation of the cell capacitor utilises the fact that there are a number of identical converter cells 7-1 or 7-2 in the power converter 1, including redundant converter cells. The converter cell that is to be subject to a measurement for determining the value of the capacitor degradation parameter associated with the degree of degradation of the cell capacitor can be a converter cell which is normally active. The corresponding converter cell is first set in a bypass mode, and the power converter continues operation with the remaining cells. At this point, the degree of degradation of the cell capacitor can be determined in the bypassed converter cell.

The bypass operation may be performed in several manners. The converter cell may for example be provided with a bypass switch, such as switch 15 of the converter cell 7-1. When the switch 15 is set in a closed state, the converter cell 7-1 is bypassed, i.e. the current flows through the switch 15 instead of through the semiconductor switching modules 9a and 9b. In this bypassed state, the cell capacitor is not charged, and the determination of the capacitor degradation may be performed.

Another way to bypass the converter cell 7-1 would be to set the lower semiconductor switching module 9b, i.e. the one which has its emitter connected to a terminal of the cell capacitor C, in an ON-state and the upper semiconductor switching module 9a, i.e. the one which has its collector connected to a terminal of the cell capacitor C, in an OFF-state, while the degree of degradation of the cell capacitor C is determined. The full-bridge converter cell 7-2 could also be either disconnected by means of a dedicated bypass switch, or by means of proper switching of the semiconductor switching modules 9a-9d. In the latter case, semiconductor switching modules 9a and 9c, or conductor switching modules 9b and 9d may be set in their ON-state, while the remaining semiconductor switching modules 9b and 9d or 9a and 9c, respectively, are set in the OFF-state for bypassing the converter cell 7-2.

Typically, the supervisory power converter controller administers the converter cells in a power converter. The supervisory power converter controller may thus, for example, itself set the cell converter to be bypassed, or it may instruct the local converter cell controller to set the converter cell in bypass mode. Moreover, the supervisory power converter controller may provide for a redundant converter cell to be set into an active state to become an active converter cell while the previously active converter cell is subjected to the cell capacitor degradation determination.

After the monitoring process is finished, the converter cell may be re-activated and it is communicated to the supervisory power converter controller that the converter cell may be operated again. The supervisory power converter controller may bring the dc-link voltage of the converter cell back to nominal voltage.

As briefly mentioned above, the determination of the value of the capacitor degradation parameter is based on the measurement parameter value which is associated with the discharging of the cell capacitor C from the measurement start voltage level at a measurement start time, at which the measurement start voltage level is across the dc-link formed by the cell capacitor C, and a measurement end voltage level at a measurement end time at which the measurement end voltage level is across the dc-link. The measurement start voltage level is preferably below the nominal dc-link voltage such that the dc-link voltage ripple has no influence on the measurement process. The nominal dc-link voltage level is the voltage level across the dc-link when the converter cell is in operation. The measurement end voltage level is preferably above the converter cell undervoltage protection level. The measurement start voltage level and the measurement end voltage level are according to one variation predetermined voltage levels, while according to another variation the measurement start time, the starting voltage and the measurement end time are predetermined. In the former case, it is known at what voltage levels the measurement start time and the measurement end time are to be registered. In the latter case it is known at what time, i.e. the measurement end time, a measurement end voltage is to be measured.

The measurement parameter value may thus be the time difference between the measurement start time and the measurement end time, or alternatively, the measurement end voltage level measured after a predetermined time has elapsed from the measurement start time. In the latter case, both the measurement start time, associated with a predetermined measurement start voltage level, and the measurement end time are hence predetermined.

In a step a) the arrangement 6 obtains the measurement parameter value which is associated with the discharging of the cell capacitor C from a measurement start voltage level at a measurement start time to a measurement end voltage at a measurement end time.

As mentioned above, according to one variation the measurement parameter value is the time difference between the measurement start time and the measurement end time. According to another variation, the measurement parameter value is the measurement end voltage level obtained or measured after a predetermined time after the measurement start time.

In a step b) the value of the capacitor degradation parameter associated with the degradation of the cell capacitor is determined based on the measurement parameter value.

The capacitor degradation parameter whose value is determined is directly proportional to the time difference between the measurement start time and the measurement end time. This capacitor degradation parameter may be the capacitance of the cell capacitor, or a ratio between the current capacitance and a reference capacitance corresponding to the capacitance of the cell capacitor when the cell capacitor was new.

When the value of the capacitor degradation parameter has been obtained, this value may be evaluated to determine whether the cell capacitor should be utilised in continued operation of the converter cell or if it has reached its end-of-life. A decrease of about 20% from the initial capacitance is typically considered to indicate an end-of-life condition of a capacitor.

According to one variation of the method, in step b) the determining of the value of the capacitor degradation parameter is further based on the measurement end voltage level. This may be the case if the measurement parameter value is the measurement end voltage level and also in the case where the measurement parameter is the time difference between the measurement start time and measurement end time.

According to one variation the determining of the value of the capacitor degradation parameter is further based on the measurement start voltage level.

In case the converter cell comprises the auxiliary power supply 8 but not the cell resistor R, the capacitance of the cell capacitor C can be determined by $$C = \frac{2 \cdot P_{aux}}{V_s^2 - V_m^2} \cdot t_d$$

where $P_{aux}$ is the power consumption of the auxiliary power supply 8, $V_s$ is the measurement start voltage level, $V_m$ is the measurement end voltage level and $t_d$ is the time difference between the measurement start time and the measurement end time. The determination of the capacitor degradation parameter, in this case the capacitance, is hence further based on the power consumption of the auxiliary power supply.

In case the converter cell comprises the cell resistor R but not the auxiliary power supply 8, the capacitance of the cell capacitor C may be determined by the following relation.

$$C = \frac{-1}{R \cdot \ln\left(\frac{V_m}{V_s}\right)} \cdot t_d$$

The determination of the capacitor degradation parameter, in this case the capacitance, is hence further based on the cell resistor R.

In variations comprising both the cell resistor R and the auxiliary power supply 8, the capacitance of the cell capacitor C may be determined by $$C = \frac{-2}{R \cdot \ln\left(\frac{V_s^2 + R \cdot P_{aux}}{V_m^2 + R \cdot P_{aux}}\right)} \cdot t_d$$

The determination of the capacitor degradation parameter, in this case the capacitance, is hence further based on the power consumption of the auxiliary power supply and on the cell resistor R.

According to one variation of the method, it is not necessary to determine the capacitance of the cell capacitor C to obtain the value of the capacitor degradation parameter. In this variation, the capacitor degradation parameter is a ratio between the current capacitance and the reference capacitance, and this ratio may be expressed as follows.

$$\frac{C_c}{C_{ref}} = \frac{t_d}{t_{ref}}$$

where $C_c$ is the current capacitance value, $C_{ref}$ is the initial capacitance value, i.e. a reference capacitance value, when the cell capacitor was new, and $t_{ref}$ is a reference time difference for discharging the capacitor from the measurement start voltage level to the measurement end voltage level when the cell capacitor was new, i.e. when it had the reference capacitance $C_{ref}$. In this variation, it is thus not necessary to determine the current capacitance if the reference time difference is available, such that the ratio between the current time difference and the reference time difference may be determined. The ratio will be a number between 0 and 1, and if the ratio is 0.8 or below, for example, the cell capacitor end-of-life condition has been reached. It should be noted that as an alternative the ratio could be inverted such that the current time difference is the denominator and the reference time difference is the numerator.

According to one variation of the method, the temperature of the cell capacitor C is also obtained and taken into account. In this case the time difference may be associated with a specific cell capacitor temperature. This temperature may be compared to a reference cell capacitor temperature that was present at the time of the reference measurement. This information may be used to determine the reliability/validity of the determination of the value of the capacitor degradation parameter. The temperature of the cell capacitor may be determined for example by means of one or more sensor(s) located in the converter cell, e.g. heat sink or ambient temperature sensors, or by estimation by means of thermal models.

In case the arrangement 6 is the supervisory power converter controller, the local converter cell controller may obtain measurements of the measurement start voltage level via a voltage sensor and register the time, i.e. measurement start time, at which the measurement start voltage level was measured. Moreover, the local converter cell controller may obtain measurements of the measurement end voltage level via a voltage sensor and register the time, i.e. the measurement end time, at which the measurement end voltage level was measured. The measurement start time and the measurement end time may then be sent to the supervisory power converter controller, which may determine the value of the capacitor degradation parameter associated with the degree of degradation based on the measurement start time and the measurement end time. Alternatively, the local converter cell controller could also determine the time difference between the measurement start time and measurement end time end send the time difference to the supervisory power converter controller, for it to determine the value of the capacitor degradation parameter. According to one variation the local converter cell controller may determine the measurement end voltage level and send the measurement end voltage level to the supervisory power converter controller for it to determine the value of the capacitor degradation parameter based on the measured measurement end voltage, i.e. in variations in which the time difference is predetermined but the measurement end voltage level at the measurement end time is unknown prior to measurement.

Alternatively, if the arrangement 6 is the local converter cell controller, the time difference may be obtained by the local converter cell controller, after the voltage measurements have been carried out and the local converter cell controller is arranged to determine the value of the capacitor degradation parameter. Alternatively, the measurement end voltage level may be obtained by the local converter cell controller in case the time difference between the measurement start time and the measurement end time is predetermined, wherein the local converter cell controller may determine the value of the capacitor degradation parameter based on the measurement end voltage level. The determined value of the capacitor degradation parameter may be sent to the supervisory power converter controller, which may store such values of the capacitor degradation parameter for all converter cells of the power converter.

It is to be noted that the method(s) presented herein could be utilised to determine the degree of degradation of the cell capacitor also in the start-up phase of the power converter after passive precharge or in idle mode.

The methods and arrangements presented herein may be utilised to determine the degree of degradation of essentially any type of capacitor in a converter cell, for example electrolytic capacitors and film capacitors.

It is envisaged that the methods and arrangements presented herein may be utilised in high-reliability applications, for example subsea applications, such as for powering pumps and compressors in subsea installations, or for subsea HVDC/HVAC power transmission and power distribution systems, as well as offshore power generation such as wind energy, tidal energy, wave energy, and ocean current energy.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of determining a capacitor degradation parameter associated with a degree of degradation of a cell capacitor in a converter cell of a power converter, the power converter comprising a plurality of identical converter cells, wherein one of the plurality of identical converter cells, prior to determining the capacitor degradation parameter, has been bypassed, wherein the capacitor degradation parameter is a capacitance of the cell capacitor, and wherein the method comprises:
   a) obtaining a measurement parameter value associated with discharging of the cell capacitor, forming a dc-link, from a measurement start voltage level at a measurement start time to a measurement end voltage level at a measurement end time,
      wherein the measurement start voltage level and the measurement end voltage level are predetermined, the measurement parameter value being a time difference between the measurement start time and the measurement end time, or wherein the measurement start time and the measurement end time are predetermined, the measurement parameter value being the measurement end voltage, and
   b) determining a value of the capacitor degradation parameter based on the time difference between the measurement start time and the measurement end time, wherein the determining of the value of the capacitor degradation parameter is further based on the measurement start voltage level, the measurement end voltage level, and a cell resistor value or a power consumption of an auxiliary power supply of the converter cell, wherein the capacitor degradation parameter is directly proportional to the time difference between the measurement start time and the measurement end time.

2. The method as claimed in claim 1, wherein the measurement start voltage level is below a nominal dc-link voltage level, the nominal dc-link voltage level being the voltage level across the dc-link when the converter cell is in operation.

3. The method as claimed in claim 1, wherein the measurement end voltage level is above a converter cell under-voltage protection level.

4. The method as claimed in claim 1, comprising obtaining a current temperature of the cell capacitor and comparing the current temperature with a reference temperature to determine the reliability of determining the capacitor degradation parameter.

5. A method of determining a capacitor degradation parameter associated with a degree of degradation of a cell capacitor in a converter cell of a power converter, the power converter comprising a plurality of identical converter cells, wherein one of the plurality of identical converter cells, prior to determining the capacitor degradation parameter, has been bypassed, wherein the method comprises:
- a) obtaining a measurement parameter value associated with discharging of the cell capacitor, forming a dc-link, from a measurement start voltage level at a measurement start time to a measurement end voltage level at a measurement end time, wherein the measurement start voltage level and the measurement end voltage level are predetermined, and wherein the measurement parameter value is a time difference between the measurement start time and the measurement end time, and
- b) determining a value of the capacitor degradation parameter based on the measurement parameter value, wherein step b) comprises determining a ratio between the time difference and a reference time difference indicative of the discharge time from the measurement start voltage to the measurement end voltage of a new cell capacitor, wherein the capacitor degradation parameter is the ratio between the time difference and the reference time difference.

6. A power converter comprising:
a plurality of identical converter cells, each converter cell comprising a cell capacitor, and each converter cell being arranged to be bypassed,
a processor for determining a capacitor degradation parameter associated with a degree of degradation of a cell capacitor, wherein the capacitor degradation parameter is a capacitance of the cell capacitor, the processor being arranged to obtain a measurement parameter value associated with discharging of the cell capacitor from a measurement start voltage level at a measurement start time to a measurement end voltage level at a measurement end time when the converter cell is bypassed,
wherein the measurement start voltage level and the measurement end voltage level are predetermined, the measurement parameter value being a time difference between the measurement start time and the measurement end time, or wherein the measurement start time and the measurement end time are predetermined, the measurement parameter value being the measurement end voltage, and
wherein the processor is arranged to determine a value of the capacitor degradation parameter based on the time difference between the measurement start time and the measurement end time, the measurement start voltage level, the measurement end voltage level, and a cell resistor value or power consumption of an auxiliary power supply of the converter cell, wherein the capacitor degradation parameter is directly proportional to the time difference between the measurement start time and the measurement end time.

7. The power converter as claimed in claim 6, wherein the processor is arranged in a local converter cell controller or a supervisory power converter controller.

8. A power converter comprising:
a plurality of identical converter cells, each converter cell comprising a cell capacitor, and each converter cell being arranged to be bypassed,
a processor for determining a capacitor degradation parameter associated with a degree of degradation of a cell capacitor, the processor being arranged to obtain a measurement parameter value associated with discharging of the cell capacitor from a measurement start voltage level at a measurement start time to a measurement end voltage level at a measurement end time when the converter cell is bypassed, and to determine a value of the capacitor degradation parameter based on the measurement parameter value,
wherein the measurement start voltage level and the measurement end voltage level are predetermined, and
wherein the measurement parameter value is a time difference between the measurement start time and the measurement end time, and
wherein the processor is arranged to determine the value of the capacitor degradation parameter by means of a ratio between the time difference and a reference time difference, the reference time difference being indicative of a discharge time from the measurement start voltage to the measurement end voltage of a new cell capacitor, wherein the capacitor degradation parameter is a ratio between the time difference and the reference time difference.

* * * * *